United States Patent [19]

Kingsbury

[11] 4,179,670

[45] Dec. 18, 1979

[54] FREQUENCY SYNTHESIZER WITH FRACTIONAL DIVISION RATIO AND JITTER COMPENSATION

[75] Inventor: Nicholas G. Kingsbury, Portsmouth, England

[73] Assignee: The Marconi Company Limited, Chelmsford, England

[21] Appl. No.: 872,828

[22] Filed: Jan. 27, 1978

[30] Foreign Application Priority Data

Feb. 2, 1977 [GB] United Kingdom ............... 4204/77

[51] Int. Cl.² ............................................. H03B 3/04
[52] U.S. Cl. ....................................... 331/10; 331/16; 331/25
[58] Field of Search .......................... 331/1 A, 10–12, 331/14, 16, 17, 18, 25

[56] References Cited

U.S. PATENT DOCUMENTS

| | | | |
|---|---|---|---|
| 3,928,813 | 12/1975 | Kingsford-Smith | 331/1 A |
| 3,959,737 | 5/1976 | Tanis | 331/1 A |
| 3,976,945 | 8/1976 | Cox | 328/14 |

OTHER PUBLICATIONS

Stokes, "Techniques of Frequency Synthesis", Proc. IEE, vol. 120, No. 10R, Oct. 1973, IEE Reviews.

Primary Examiner—Siegfried H. Grimm
Attorney, Agent, or Firm—Kirschstein, Kirschstein, Ottinger & Cobrin

[57] ABSTRACT

A frequency synthesizer in which good resolution is obtained by a unity increase of the dividing ratio for a controlled proportion of the reference frequency cycles thus giving a fractional dividing ratio. Phase jitter that could be expected to result is eliminated by keeping a running count of the phase error produced by these changes of dividing factor and adding a corresponding voltage to the output of the phase comparator. Smoothing of the comparator output is thus no problem and the loop filter does not therefore have to have a narrow bandwidth. The loop bandwidth must be an order lower than the reference frequency and since now the loop bandwidth can be increased so can the reference frequency. The fractional dividing ratio ensures that the resolution is not limited by the reference frequency and thus the previously incompatible combination of fine resolution, wide loop bandwidth (for low phase noise) and a relatively unrestricted reference frequency is achieved.

7 Claims, 6 Drawing Figures

Fig.1. SIMPLE SINGLE-LOOP FREQUENCY SYNTHESISER

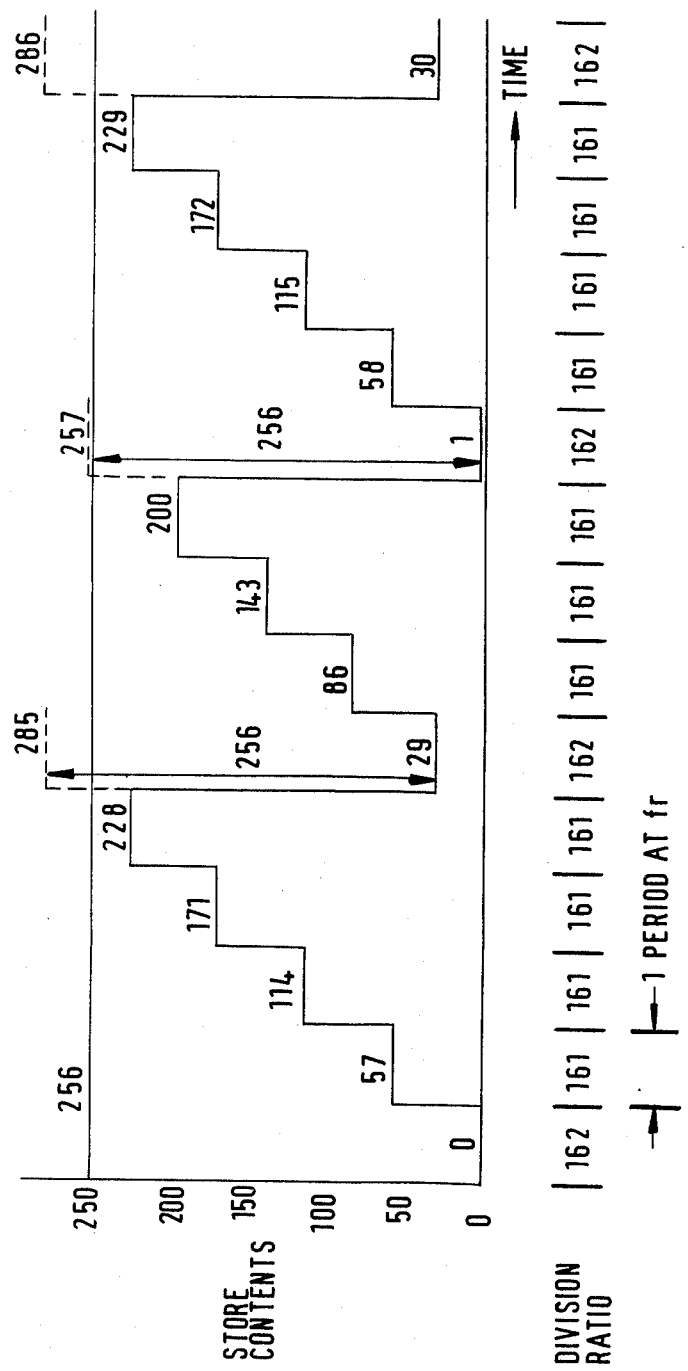
Fig. 3. OPERATION OF STORE AND ADDER IN FIG. 2.
WHEN M=161, N=57, AND n=8 ($2^n$=256)

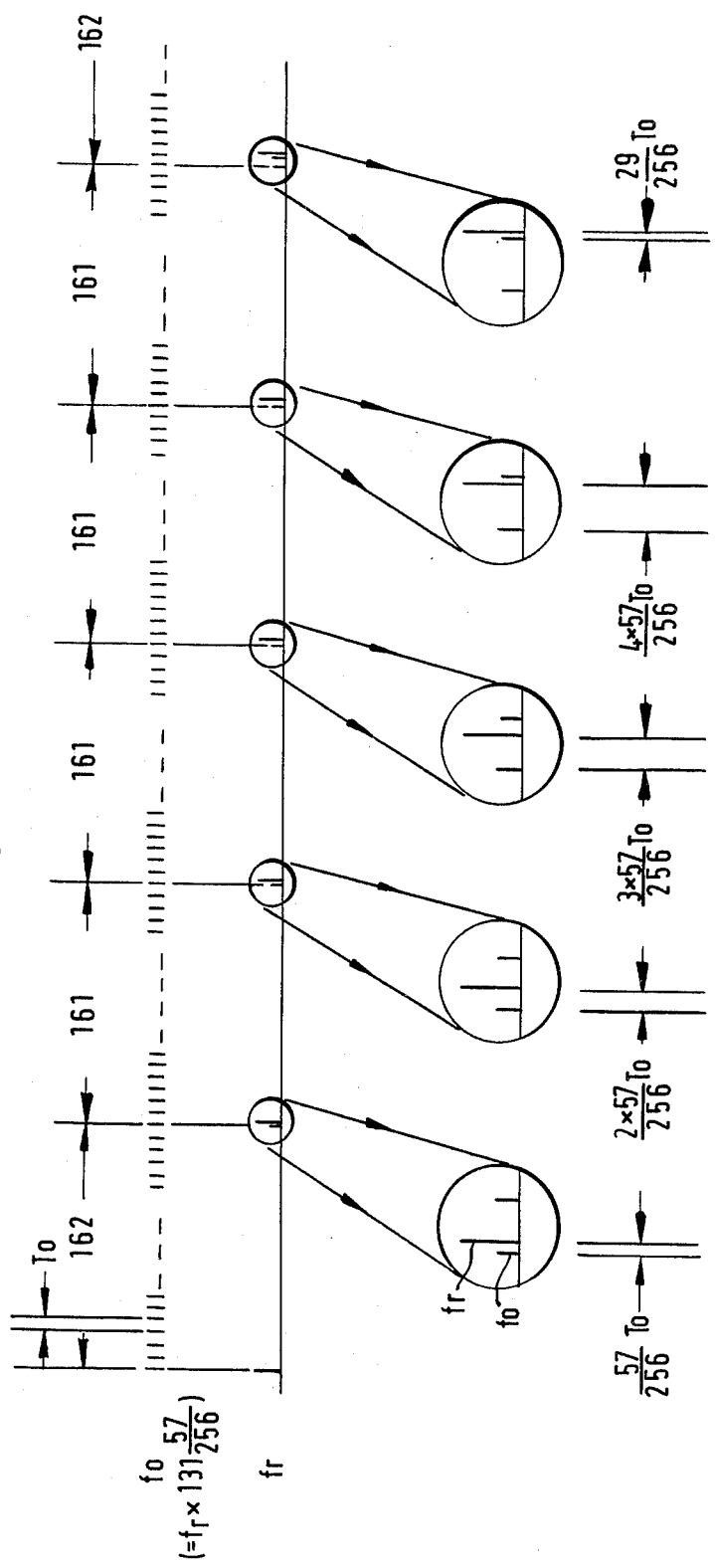

FREQUENCY OFFSET CONTROL FOR THE FIG.2. SYNTHESISER

FREQUENCY SYNTHESIZER WITH FRACTIONAL DIVISION RATIO AND JITTER COMPENSATION

This invention relates to frequency synthesizers and is particularly concerned with providing, economically, a frequency synthesizer having fine resolution between its output frequencies and good regularity of output signal.

The purpose of a frequency synthesizer is to generate selectively any one of a number of frequencies with an accuracy determined by a fixed reference frequency source. Where the output signal from the synthesizer is a sine wave this should be a pure sine wave with as little phase noise as possible. Phase noise is a feature of synthesizers which maintain a frequency by periodic adjustments of phase. Low phase noise is particularly important in communication systems using phase modulation.

One of the simplest forms of synthesizer is the single-loop synthesizer, illustrated in FIG. 1 of the accompanying drawings. A voltage-controlled oscillator (VCO) generates the output signal with frequency, $f_o$, which is divided by a factor, M.P. and compared, by means of a phase comparator, with the reference frequency $f_r$. When the loop is phase locked, the frequencies of the two inputs to the phase comparator are equal. Therefore $$f_o = M.P. \ f_r$$

$f_o$ is varied by changing M, which, by the nature of the divider, which in fact is a counter, must be an integer. Therefore the minimum difference (or resolution) between values of $f_o$ is $P.f_r$.

For many synthesizer applications fine resolution is an important requirement and so both P and $f_r$ must be minimised. The fixed divider is also a counter so that P must be an integer and therefore cannot be less than 1. Thus $f_r$ must be at least as low as the required resolution (possibly 100 Hz or less). P would normally be 1, unless $f_o$ is too high for correct operation of the programmable divider, in which case the minimum value able to provide the divider with a low enough frequency would be chosen.

Low values of $f_r$ have the disadvantage of requiring a narrow loop bandwidth. This must be an order of magnitude lower than $f_r$, so that the loop filter can adequately smooth the output from the phase comparator without causing the loop to become unstable. At frequencies within the loop bandwidth any phase jitter, i.e. sudden phase change, from the VCO tends to be corrected by the negative feedback of the loop. However at frequencies outside the loop bandwidth, VCO phase jitter is not corrected and can be very bad if the loop bandwidth is narrow. An LC-tuned VCO giving an output frequency of the order of 50 MHz would probably require a loop bandwidth of at least 1 kHz, in order to keep the phase jitter below 10 degrees. A crystal VCO would be better but would have a very narrow tuning range.

It will be seen therefore that fine resolution requires a narrow loop bandwidth while low phase noise requires a wide bandwidth.

This incompatibility of fine resolution and wide loop bandwidth, required for low phase noise, is thus the main disadvantage of the above simple single-loop synthesizer. A further disadvantage of a narrow loop bandwidth is the long settling time before the output frequency reaches the correct value.

Various techniques have been proposed in attempts to overcome the problems of the single loop synthesizer. Unfortunately, these alternative techniques all suffer from having more than one VCO and phase-locked loop. VCO's and high frequency dividers both tend to consume significant amounts of power, and each phase comparator, loop filter, and VCO are a potential source of phase noise. Therefore, a single-loop scheme is attractive if the disadvantages above can be overcome.

One previously proposed technique, a so-called side-step programming scheme, is based on the single loop and obtains finer resolution without reducing $f_r$ by simulating non-integer values of M in the programmable divider. The non-integer division ratios are simulated by dividing by M+1 instead of M on a proportion, x, of the cycles, giving an average division ratio which approximates closely to M+x. The main disadvantage of this scheme is the phase jitter, which is generated on the divider output by changing between two different division ratios. If this jitter is not to cause significant phase jitter on the VCO output, it must be attenuated by the loop filter, which again tends to require a narrow loop bandwidth.

It is thus an object of the present invention to provide a single-loop synthesizer employing 'sidestep programming' and in which the effect of the divider phase jitter is largely eliminated while still obtaining good frequency resolutions.

According to the present invention, therefore, in a frequency synthesizer comprising a controllable oscillator, a frequency divider of integral divisor, and a phase comparator in a feedback loop arranged to control the oscillator to a frequency which is related to a reference frequency by the divisor, said divisor includes, or consists of, a controllable integral factor which is changed periodically by an integer when the accumulated sum of a periodically occurring first quantity amounts to, or exceeds, a predetermined second quantity, so as to produce, in effect, a non-integral relation between the oscillator frequency and the reference frequency, and further, a signal representative of said sum as it is accumulated is arranged in conjunction with the output of said phase comparator, to control said oscillator so as to suppress phase jitter in the oscillator output signal that would otherwise result from periodic changes of said integral factor.

The first quantity preferably occurs once in each period of the reference frequency, the ratio of the first to the second quantities being equal to the fractional average increase of said integral factor.

A digital store may be arranged to accumulate said first quantity once in each period of the reference frequency and to increase said integral factor by unity in any period of the reference frequency in which said second quantity has been equalled or exceeded, the content of said digital store being applied to a digital-to-analogue (D-A) converter for inclusion in the output of said phase comparator.

The analogue output of said D-A converter is preferably incorporated with the output of said phase comparator for a fraction of each period of the reference frequency which fraction is determined directly by the mark/space ratio of the output of the frequency divider, said analogue output thereby being scaled automatically in accordance with the magnitude of said non-integral relation.

The first quantity accumulated once in each period of the reference frequency may be varied by a small proportion periodically to provide an average value of said first quantity between the digital values permitted by said digital store.

Periodic variation of the first quantity may be effected by a delta-sigma modulator clocked at said reference frequency and having a binary output having a mark/space ratio determined by a continuously variable input signal, said binary output determining the addition or no addition of unity to said accumulated sum in each period of said reference frequency.

Means may be provided for adding to a digital representation of said first quantity a digital representation of a controllable offset voltage having a range corresponding to plus and minus a change of unity in said integral factor, said integral factor being controllable in dependence upon the value of said first quantity, the magnitude and polarity of said offset voltage, and said accumulated sum, so that the output frequency is offset from the value determined by said first quantity by an amount determined by said offset voltage.

A frequency synthesizer in accordance with the invention, and various modifications, will now be described, by way of example, with reference to the accompanying drawings, in which:

FIG. 1 is a block diagram of a known single loop frequency synthesizer already referred to;

FIG. 3 is a diagram illustrating the operation with time of part of the circuitry of FIG. 2;

FIG. 4 is a timing diagram illustrating the relation between reference and output frequencies in FIG. 2.

Figure 1:
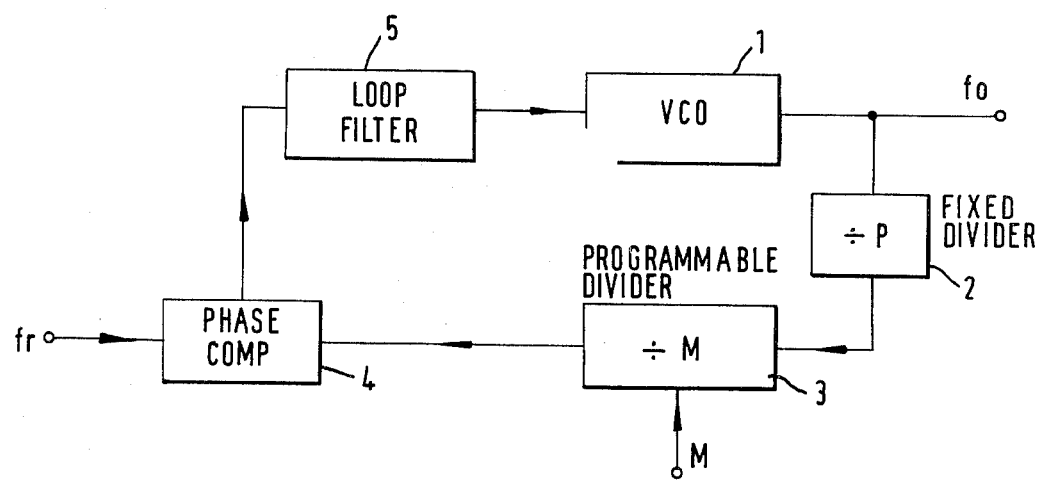

The basic single-loop synthesizer of FIG. 1 has already been referred to broadly. It consists of a voltage-controlled-oscillator 1, a two-stage frequency divider 2, 3, and a phase-comparator 4 the output of which is applied to control the VCO 1 by way of a low-pass loop filter 5. A sinusoidal output signal of frequency $f_o$ is derived from the VCO. Zero crossings, or other cycle markers, are counted by the divider 2 which gives one output pulse for every P input cycles. The programmable divider 3 is also in effect a counter, giving out one pulse for every M input pulses. The integral dividing factor M is, however, controllable according to an external input value.

The output of the programmable divider is a pulse of width equivalent to one or more of the input pulses as desired. This feature is made use of in the invention, as will be explained subsequently.

The phase comparator 4 gives an output which varies with the phase difference between the divider output and the reference frequency and will require to be filtered by the loop filter 5 to maintain stability of operation. For this reason the bandwidth of the filter 5 must be restricted in relation to the reference frequency $f_r$.

Figure 2:
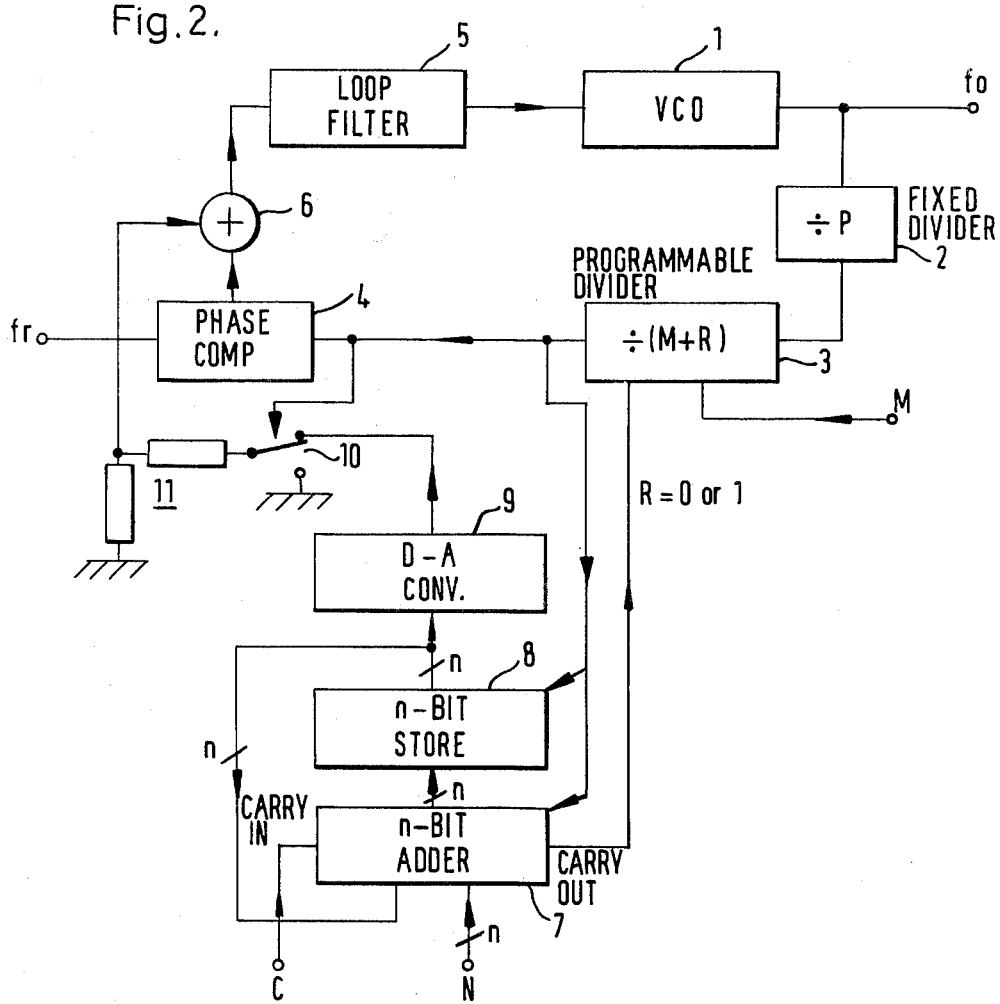
FIG. 2 is a block diagram of a synthesizer according to the invention.

Referring now to FIG. 2 this shows an embodiment of the invention in which sidestep programming is employed to obtain effectively non-integral values of the dividing factor of the divider 3. In this arrangement the dividing factor, normally M, is periodically increased to $M+1$ for a fraction x of periods at the reference frequency $f_r$. As mentioned above this technique alone tends to introduce phase jitter into the loop as a result of the periodic phase changes of the output of the programmable divider. In FIG. 2, this jitter is avoided by, in effect, subtracting out the step change in the error output from the comparator 4 that would arise in the known sidestepping technique, over the period of that step change. This is achieved by adding into the output of the comparator 4 by way of an adder 6 a voltage which represents the continuously increasing phase error in the pulse train output from the programmable divider 3. The result is that the VCO receives a steady control signal and produces a jitter-less output signal $f_o$, while there is still a step change in the divider output phase.

This correcting voltage is derived as follows. An n-bit adder 7 is supplied, at every output pulse from the divider 3, i.e. at the reference frequency, with a number N in binary form on n parallel wires.

The adder 7 adds the number N to the contents of an n-bit store 8 at every divider output pulse and deposits the total in the store 8 ready for the next increment. The store will therefore be filled after a number of cycles at $f_r$ which number is the reciprocal of the fraction $N/2^n$. When the store is filled a carry bit becomes '1' and is used to increase the dividing factor by unity it thus being $M+1$. The dividing factor is thus increased by unity once in every $2^n/N$ cycles at $f_r$ and the fraction x is therefore $N/2^n$. The average dividing ratio is given by $M+x$, i.e. $M+N/2^n$. N is therefore the numerator of the fraction by which it is required to increase M, and $2^n$ is the denominator.

FIG. 3 illustrates this process over a period of three such cycles of the dividing factor in a case where $M=161$, $N=57$ and $n=8$. It can be seen that the store is filled, on average, in about $4\frac{1}{2}$ cycles at the reference frequency, i.e. 256/57, the dividing factor increasing from 161 to 162 each time the maximum store content of 256 is reached or exceeded.

FIG. 4 shows the phase relation between the input pulse train to the programmable divider at frequency $f_o$ (assuming that P in the fixed divider is unity), and the reference frequency pulse train $f_r$. It can be seen in the expanded portions of the diagram how the phase error increases in each count of 161 input pulses until it amounts to a period $T_o$ at the frequency $f_o$. Only then is a correction made by increasing the count to 162. It is this error which is detected by the phase comparator and emerges as a jitter voltage on the comparator output.

The invention overcomes this difficulty as follows. In FIG. 2, in addition to the adder/store combination providing a divider correction to achieve a correct average dividing factor, the store content, i.e. the accumulated sum shown in FIG. 3, is applied to a digital-to-analogue (D-A) converter 9 at each increment to provide an analogue signal continuously representative of the phase error between the reference frequency pulses and the nearest preceding pulse input to the programmable divider. This analogue signal is of course a reflection of the jitter voltage that appears in the output of the phase comparator since they have a common cause. The D-A output voltage is therefore appropriate, with suitable scaling, for incorporation with the comparator output signal so as to eliminate the jitter voltage. The analogue voltage is therefore applied to an adder 6 by way of a switch 10 in the position shown, and a scaling resistor network 11. The scaling of the D-A converter output should be such that the full scale peak-to-peak voltage from the D-A converter should cancel out the voltage change on the phase comparator output, produced by a phase shift of 1 cycle ($T_o$) at the programmable divider input. However, the comparator output error voltage has a maximum value dependent upon the value of $T_o$ (i.e. the period of the input pulses to the programmable divider) as a fraction of the reference signal period $T_r$. It is therefore proportional to $f_r/f_o$. The maximum output voltage of the D-A converter, on the other hand, is independent of any phase or frequency relation. To maintain the cancellation of phase-jitter voltages therefore, it is necessary to make the D-A converter output voltage dependent on the relation $f_r/f_o$.

In accordance with a feature of the invention this is done in the following manner. The output pulse train from the divider 3 can be arranged to have pulses of various widths which are multiples of the input period. If there are 'k' input periods in an output pulse and the repetition rate is $f_r$, then the mean value of this pulse stream from the divider is kP ($f_r/f_o$) of its peak value. That is, the mean value is a function of the desired frequency ratio. The switch 10 is therefore operated by this pulse train from the divider which effectively pulse width modulates the analogue output of the D-A converter in accordance with the $f_r/f_o$ ratio.

The two-way analogue switch 10 applies this scaling factor to the D-A converter output while the resistive network 11 provides the remaining scaling which will depend on k, P, and the conversion gains of the D-A converter and phase comparator (all of which are constants). The analogue switch can be arranged to isolate the D-A converter while the store contents are changing, so that the resultant spikes on the D-A converter output do not cause noise in the phase-locked loop.

Figure 5:
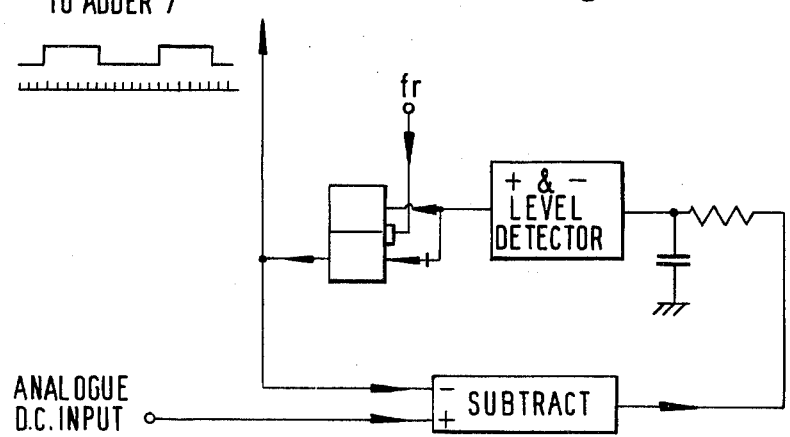
FIGS. 5 and 6 show modifications of the circuit of FIG. 2.

The arrangement of FIG. 2 is capable of giving a basic frequency resolution of $P \cdot f_r/2^n$. This resolution may be improved by increasing n or by applying a variable mark/space ratio signal to the least significant carry input, C, of the adder. The variable mark/space ratio signal can be generated by a delta-sigma modulator as shown in FIG. 5, clocked at $f_r$, and in this way an infinitely variable interpolation between adjacent frequency settings can be achieved.

The effect of this latter modification is to add unity to the numerator N for a proportion of the $f_r$ periods on a cyclic basis, the proportion being determined by the mark/space ratio of the delta-sigma modulator. The numerator N is thereby increased by a fraction which is infinitely controllable in dependence upon the d.c. controlling input to the delta-sigma modulator.

Since the fundamental problem of resolution with a single loop synthesizer is now overcome, the value of $f_r$ could theoretically be raised until it is of the same order as $f_o$. However, it would be desirable not to increase the value of $f_r$ much above 100 kHz in order that the D-A converter and adders do not have to be power consuming high speed devices. The resulting loop bandwidth of up to 10 kHz should be adequate to ensure low phase noise from a well designed LC tuned VCO operating up to 100 MHz. If this is not so, then the only penalty of a higher comparison frequency is greater power consumption in the D-A converter and adders.

The synthesizer design outlined in FIG. 2 has theoretically infinite resolution, if delta-sigma interpolation is employed, but basically the digital frequency selection inputs M and N give a resolution of $Pf_r/2^n$. This is inconvenient if the more usual decade selection of output frequency is required, because this binary power relationship between reference frequency and resolution interval prevents a standard 1 MHz or 5 MHz source producing a decade output range.

In addition, frequency selection devices in decade form commonly produce outputs in binary-coded-decimal form. The entire decade number of 6 decimal digits or more in BCD form would have to be converted to binary form to provide M and N.

The system of FIG. 2 can be modified to overcome both of these problems. It is necessary to convert the store and adder so that it accumulates numbers modulo $10^m$ instead of $2^n$. Suitable values for m and n are 3 and 10, so that a modulo 1024 accumulator must be changed to be modulo 1000. This can be achieved by adding 24 to the contents of the accumulator each time the most significant carry bit is generated. Thus, rather than reduce the maximum content the initial content is increased by 24. With the modulo 1000 accumulator, the basic resolution becomes $P \cdot f_r/1000$ and the reference frequency can be 1000/P times the basic frequency (i.e. $f_r = 100$ kHz for 100 Hz basic resolution and P=1).

The three least significant digits of the decade number extend the frequency selection resolution 1000 times. Similarly the 1000 steps of the (modified) modulo 1000 accumulator extend the output frequency resolution 1000 times. These three digits can therefore be converted into binary format to control the step count of the accumulator on a one to one basis. Only these three digits need be converted into binary format since the most significant digits can directly control decade counters in the programmable divider.

The conversion of a 3-digit BCD number into a 10-bit binary number requires five 4-bit full adders but there are sufficient spare inputs in the adders to enable 24 to be added whenever a carry bit is generated. If A, B and C are the three BCD digits and R (=0 or 1) is the carry bit, the binary value of N can be calculated as follows:

$$N = 100A + 10B + C + 24R$$
$$= 64A + 32A + 4A + 8B + 2B + C + 16R + 8R$$

The five 4-bit adders are needed to evaluate this summation when A, B and C are 4-bit BCD numbers and R is a 1-bit number.

Alternatively, a modulo 1000 accumuator could be constructed using three 4-bit BCD adders and a 12-bit store. This would have the advantage of not requiring BCD-to-binary conversion of its control word, N. However, the information in the store would then be in 3-digit BCD format which would not be able to drive the D-A converter, unless either the D-A converter were programmed to accept BCD inputs (very rare), or a BCD-to-binary conversion were performed (defeating the object of avoiding the conversion of N).

The above argument favours the former method of modulo-1000 accumulation for the three most significant decimal digits of N; but, if extra digits are required for more resolution, BCD accumulators for these digits would offer the simplest solution since there would be no need for these digits to drive the D-A converter. Three digit control of the D-A converter would contribute only 0.36P degrees peak-to-peak to the output phase jitter (neglecting any attenuation by the loop filter).

In certain synthesizer applications, the output frequency is required to be the sum of a preset frequency and a variable offset which may be positive or negative. Such an application occurs, for example, in a radio receiver when it is required to phase lock the local oscillator (the synthesizer) to the incoming signal; therefore the synthesizer must have a voltage controlled offset input.

Voltage control of the synthesizer may be achieved by analogue-to-digital conversion of the voltage into a binary offset word. This can then be added to the preset frequency value, and the result used to control the synthesizer. It is usually desirable for both positive and negative offset values to be available; this requires the control range of the programmable divider in the synthesizer to be $M-1$, $M$, $M+1$ and $M+2$, instead of just $M$ and $M+1$ (where $M$ is the integer part of the preset frequency control word).

Thus the dividing factor swings between $M-1$ and $M$ when the offset value is negative and greater than $N$; between $M$ and $M+1$ when the offset value is either negative and smaller than $N$ or positive and smaller than $2^n+N$; and between $M+1$ and $M+2$ when the offset value is positive and greater than $2^n-N$. The programmable divider must therefore be controlled accordingly, $R$ being 0, 1, 2 or 3 according to the magnitude and polarity of the offset and the content of the accumulator store, full or not.

Figure 6:
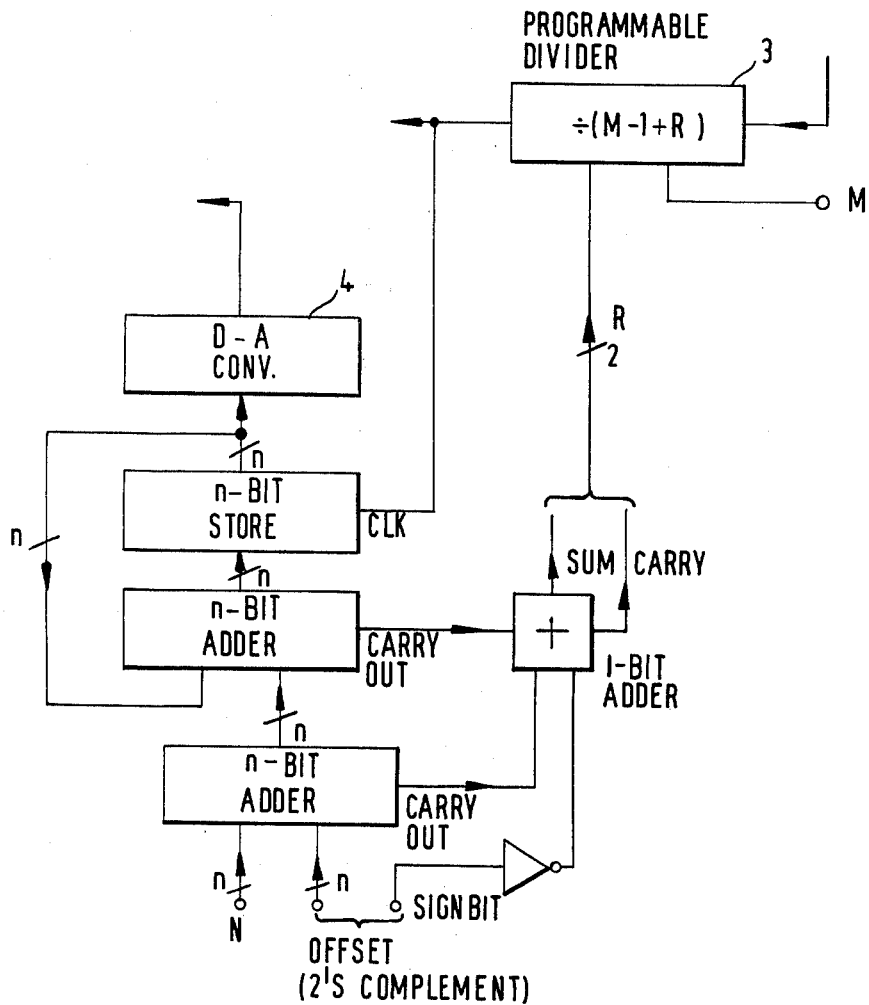

FIG. 6 shows how the offset word may be added to the fractional part of the control word, N, and also how the correct ratio for the programmable divider may be calculated. The offset word is assumed to be in $(n+1)$-bit 2's complement format and is converted to offset binary format by inverting the sign bit. The 2-bit value of $R$ is calculated by adding the inverted sign bit of the offset word to the 'carry out' bits from the two adders. The programmable divider is designed to divide by $M-1+R$ to give the required control range. ($R=0$, 1, 2 or 3). The total offset control range of this configuration is ±one l.s.b. of M, which is $\pm P\, f_r$.

In order to add frequency offset control to a synthesizer with decade frequency selection, a similar technique to that of FIG. 6 may be used except that both addition operations must be performed modulo $10^m$ instead of $2^n$. For modulo 1000 addition, 24 must be added to the result for each 'carry out' bit that is generated, i.e. a total of $24+(R-1)$ must be added to the result.

I claim:

1. A frequency synthesizer including a feedback loop comprising a controllable oscillator, a frequency divider, said frequency divider having an integral dividing factor, a phase comparator, the output of said oscillator being divided by said frequency divider and applied to said phase comparator for comparison with a reference signal, and the frequency of said oscillator being controlled by an error signal from said phase comparator, the synthesizer further including a digital store for accumulating a periodically occurring first quantity, means responsive to the accumulated sum of said first quantity to change said integral dividing factor by an integer when the content of said store reaches a predetermined second quantity, to produce, on average, a non-integral relation between the oscillator frequency and the reference frequency, a digital/analogue converter for converting the content of said store into a jitter compensating signal and means for combining said jitter compensating signal with said error signal to suppress phase jitter in said oscillator output signal.

2. A frequency synthesizer according to claim 1, wherein said first quantity occurs once in each period of said reference signal and the resulting average increase in said integral dividing factor is a fraction equal to the ratio of said first quantity to said second quantity.

3. A frequency synthesizer according to claim 1, wherein said integral dividing factor is increased by unity when the content of said store equals said predetermined second quantity.

4. A frequency synthesizer according to claim 3, and comprising means for combining said jitter compensating signal with said error signal for a proportion of the time cyclically, said proportion being determined by the mark/space ratio of the output signal of said frequency divider.

5. A frequency synthesizer according to claim 3, including means for generating a digital representation of a controllable offset voltage having a range corresponding to plus and minus a change of unity in said integral dividing factor, means for adding said digital representation to a digital representation of said first quantity to make said integral dividing factor dependent upon the combination of magnitude and polarity of offset voltage, and said first quantity, said output frequency being offset from the value determined by said first quantity by an amount determined by said offset voltage.

6. A frequency synthesizer including a feedback loop comprising a controllable oscillator, a frequency divider, said frequency divider having an integral dividing factor, a phase comparator, the output of said oscillator being divided by said frequency divider and being applied to said phase comparator for comparison with a reference signal, and the frequency of said oscillator being controlled by an error signal from said phase comparator, the synthesizer further including a digital store for accumulating a periodically occurring first quantity, means for varying said first quantity by a small proportion periodically to provide an average value of said first quantity between the digital values permitted by said digital store, means responsive to the accumulated sum of said first quantity to change said integral dividing factor by an integer when the content of said store equals a predetermined second quantity, to produce, on average, a non-integral relation between the oscillator frequency and the reference frequency, a digital/analogue converter for converting the content of said store into a jitter compensating signal and means for combining said jitter compensating signal with said error signal to suppress phase jitter in said oscillator output signal.

7. A frequency synthesizer according to claim 6, wherein said means for varying said first quantity comprises a delta-sigma modulator clocked at the frequency of said reference signal and having a binary output having a mark/space ratio determined by a continuously variable input signal, and means for varying said first quantity by 1 or 0 in accordance with said binary output.

* * * * *